(12) United States Patent
Shah et al.

(10) Patent No.: US 6,893,927 B1
(45) Date of Patent: May 17, 2005

(54) METHOD FOR MAKING A SEMICONDUCTOR DEVICE WITH A METAL GATE ELECTRODE

(75) Inventors: Uday Shah, Portland, OR (US); Mark L. Doczy, Beaverton, OR (US); Justin K. Brask, Portland, OR (US); Jack Kavalieros, Portland, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 10/805,880

(22) Filed: Mar. 22, 2004

(51) Int. Cl.[7] .............................................. H01L 21/336
(52) U.S. Cl. .......................... 438/287; 438/3; 438/200; 438/240; 438/241; 438/279
(58) Field of Search ................................. 438/287, 240, 438/3, 279, 241, 200, 275, 303, 592, 216

(56) References Cited

U.S. PATENT DOCUMENTS

| | | | |
|---|---|---|---|
| 6,063,698 A | 5/2000 | Tseng et al. ................ | 438/585 |
| 6,184,072 B1 | 2/2001 | Kaushik et al. ............. | 438/197 |
| 6,306,715 B1 * | 10/2001 | Chan et al. .................. | 438/301 |
| 6,403,423 B1 * | 6/2002 | Weybright et al. .......... | 438/279 |
| 6,420,279 B1 | 7/2002 | Ono et al. ................... | 438/785 |
| 6,432,779 B1 * | 8/2002 | Hobbs et al. ............... | 438/287 |
| 6,475,874 B2 | 11/2002 | Xiang et al. ................ | 438/396 |
| 6,485,989 B1 * | 11/2002 | Signorini ....................... | 438/3 |
| 6,514,828 B2 | 2/2003 | Ahn et al. ................... | 438/240 |
| 6,544,906 B2 | 4/2003 | Rotondaro et al. ......... | 438/785 |
| 6,617,209 B1 | 9/2003 | Chau et al. ................. | 438/240 |
| 6,617,210 B1 | 9/2003 | Chau et al. ................. | 438/240 |
| 6,620,713 B2 | 9/2003 | Arghavani et al. .......... | 438/585 |
| 6,689,675 B1 | 2/2004 | Parker et al. ............... | 438/585 |
| 6,696,327 B1 | 2/2004 | Brask et al. ................ | 438/197 |
| 6,696,345 B2 | 2/2004 | Chau et al. ................. | 438/387 |
| 2002/0197790 A1 | 12/2002 | Kizilyalli et al. ............ | 438/240 |
| 2003/0032303 A1 | 2/2003 | Yu et al. ..................... | 438/770 |
| 2003/0045080 A1 | 3/2003 | Visokay et al. ............. | 438/591 |
| 2003/0180968 A1 * | 9/2003 | Nallan et al. .................. | 438/3 |
| 2003/0198104 A1 * | 10/2003 | Lee ............................. | 365/200 |
| 2004/0000695 A1 * | 1/2004 | Matsuo ....................... | 257/412 |
| 2004/0023478 A1 * | 2/2004 | Samavedam et al. ....... | 438/592 |

OTHER PUBLICATIONS

Polishchuk et al., "Dual Workfuntion CMOS Gate Technology Based on Metal Interdiffusion", www.eesc.berkeley.edu, 1 page.

Doug Barlage et al., "High–Frequency Response of 100nm Integrated CMOS Transistors with High–K Gate Dielectrics", 2001 IEEE, 4 pages.

Lu et al., "Dual–Metal Gate Technology for Deep–Submicron CMOS Devices", dated Apr. 29, 2003, 1 page.

Schwantes et al., "Performance Improvement of Metal Gate CMOS Technologies with Gigabit Feature Sizes", Technical University of Hanburg–Harburg, 5 pages.

Brask et al., "A Method for Making a Semiconductor Device Having a Metal Gate Electrode," U.S. Appl. No. 10/704,497, filed Nov. 6, 2003.

Brask et al., "A Method for Etching a Thin Metal Layer", U.S. Appl. No. 10/704,498, filed Nov. 6, 2003.

Brask et al., "A Method for Making a Semiconductor Device with a Metal Gate Electrode that is Formed on an Annealed High–K Gate Dielectric Layer", U.S. Appl. No. 10/742,678, filed Dec. 19, 2003.

* cited by examiner

*Primary Examiner*—Matthew Smith
*Assistant Examiner*—Igwe U. Anya
(74) *Attorney, Agent, or Firm*—Mark V. Secley

(57) ABSTRACT

A method for making a semiconductor device is described. In that method, a metal layer is formed on a dielectric layer, which is formed on a substrate. After forming a masking layer on the metal layer, the sides of the masking layer are lined with a sacrificial layer.

3 Claims, 5 Drawing Sheets

//METHOD FOR MAKING A SEMICONDUCTOR DEVICE WITH A METAL GATE ELECTRODE

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

A metal gate electrode may be formed on a high-k dielectric layer by depositing a metal layer on the dielectric layer, masking the metal layer, and then removing the exposed part of that layer. A patterned polysilicon layer may be used to mask the metal layer, and a dry etch process may be used to remove the exposed part of that layer. When, however, such a dry etch process is used to remove part of the metal layer, metal and metal compounds may be sputtered onto the sides of the patterned polysilicon layer. Such residues may be difficult to remove, and perhaps most importantly, may react with the polysilicon irreversibly to form an undesirable silicide.

Such a dry etch step may be replaced with a wet etch process. When, however, a wet etch step is used to etch the metal layer, it may etch that layer the metal layer from beneath the patterned polysilicon layer. The resulting undercut may have adverse consequences.

Accordingly, there is a need for an improved process for making a semiconductor device that includes a metal gate electrode. There is a need for such a process that enables an exposed part of a metal layer to be removed without depositing undesirable residues on the sides of an overlying masking layer and without removing significant portions of the metal layer from beneath that masking layer. The method of the present invention provides such a process.

Figure 1A:
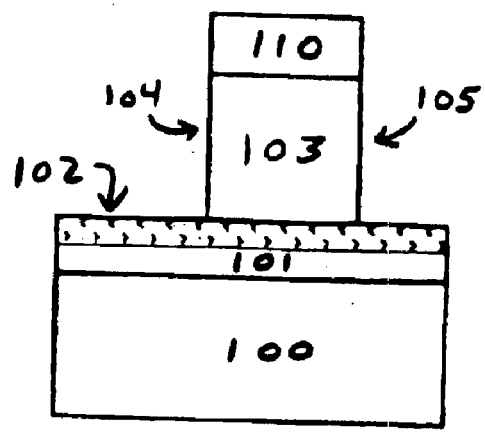
FIGS. 1a–1f represent cross-sections of structures that may be formed when carrying out an embodiment of the method of the present invention.
Figure 1B:
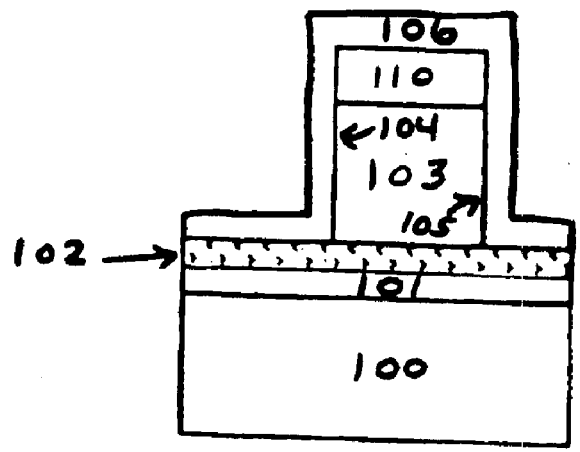

Features shown in these figures are not intended to be drawn to scale.

DETAILED DESCRIPTION OF THE PRESENT INVENTION

A method for making a semiconductor device is described. That method comprises forming a dielectric layer on a substrate, and forming a metal layer on the dielectric layer. After forming a masking layer on the metal layer, the sides of the masking layer are lined with a sacrificial layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1f illustrate structures that may be formed, when carrying out an embodiment of the method of the present invention. Initially, dielectric layer 101 is formed on substrate 100, metal layer 102 is formed on dielectric layer 101, and masking layer 103 is formed on metal layer 102, generating the FIG. 1a structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 preferably comprises a high-k gate dielectric layer. Some of the materials that may be used to make high-k gate dielectrics include: hafnium oxide, hafnium silicon oxide, lanthanum oxide, zirconium oxide, zirconium silicon oxide, tantalum oxide, titaniumoxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form dielectric layer 101 are described here, that layer may be made from other materials that serve to reduce gate leakage.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 60 angstroms thick, and more preferably between about 5 angstroms and about 40 angstroms thick.

Although not shown in FIG. 1a, it may be desirable to form a capping layer, which is no more than about five monolayers thick, on dielectric layer 101. Such a capping layer may be formed by sputtering one to five monolayers of silicon, or another material, onto the surface of dielectric layer 101. The capping layer may then be oxidized, e.g., by using a plasma enhanced chemical vapor deposition ("PECVD") process or a solution that contains an oxidizing agent, to form a capping dielectric oxide.

Although in some embodiments it may be desirable to form a capping layer on dielectric layer 101, in the illustrated embodiment metal layer 102 is formed directly on dielectric layer 101. Metal layer 102 may comprise any conductive material from which a metal gate electrode may be derived, and may be formed on dielectric layer 101 using well known PVD or CVD processes. Examples of n-type materials that may be used to form metal layer 102 include: hafnium, zirconium, titanium, tantalum, aluminum, and metal carbides that include these elements, i.e., titanium carbide, zirconium carbide, tantalum carbide, hafnium carbide and aluminum carbide. Examples of p-type metals that may be used include: ruthenium, palladium, platinum, cobalt, nickel, and conductive metal oxides, e.g., ruthenium oxide. Although a few examples of materials that may be used to form metal layer 102 are described here, those layers may be made from many other materials.

Metal layer 102 should be thick enough to ensure that any material formed on it will not significantly impact its workfunction. Preferably, metal layer 102 is between about 25 angstroms and about 300 angstroms thick, and more preferably is between about 25 angstroms and about 200 angstroms thick. When metal layer 102 comprises an n-type material, layer 102 preferably has a workfunction that is between about 3.9 eV and about 4.2 eV. When metal layer 102 comprises a p-type material, layer 102 preferably has a workfunction that is between about 4.9 eV and about 5.2 eV.

After depositing metal layer 102 on dielectric layer 101, masking layer 103 is formed on metal layer 102. Masking layer 103 may be formed by depositing a polysilicon layer on metal layer 102 and then patterning the polysilicon layer to generate a patterned polysilicon layer. Such a polysilicon layer may be undoped or doped with either n-type or p-type impurities, may be deposited using conventional methods, and preferably is between about 500 angstroms and about 2,000 angstroms thick.

A patterned polysilicon layer may be created by first forming a hard mask that covers part of the polysilicon layer, and leaves part of that layer exposed. Such a hard mask may comprise silicon nitride, silicon dioxide, silicon oxynitride, or a nitrided silicon dioxide. The hard mask may be between about 100 angstroms and about 500 angstroms thick, and may be deposited and patterned using conventional techniques. The exposed part of the polysilicon layer may then be removed using a dry etch process that is selective to metal layer 102. Such a dry etch process may employ a plasma that is derived from a combination of gases, e.g., a combination of hydrogen bromide, chlorine, argon, and oxygen. The optimal process for etching the polysilicon layer may depend upon the material used for metal layer 102, the degree to which the polysilicon layer is doped, and the desired profile for the resulting etched layer.

Hard mask 110 may be retained after masking layer 103 is formed to protect masking layer 103 during subsequent etching operations. After forming the FIG. 1*a* structure, first side 104 and second side 105 of masking layer 103 are lined with a sacrificial layer. Masking layer 103 is lined with such a layer to prevent metal and metal compounds from coating masking layer 103, when metal layer 102 is etched. To line sides 104, 105 with a sacrificial layer, layer 106 is initially deposited onto metal layer 102, hard mask 110, and sides 104, 105 of masking layer 103, generating the FIG. 1*b* structure.

Layer 106 may comprise any material that may protect masking layer 103, when metal layer 102 is etched, and that may be removed after metal 102 is etched without damaging masking layer 103 or hard mask 110. Examples of materials that may be used to form layer 106 include silicon nitride, a carbon doped silicon nitride, and silicon dioxide. Preferably, layer 106 comprises a material that may be etched selectively to hard mask 110. Layer 106 may be deposited onto metal layer 102, hard mask 110 and sides 104, 105, using a conventional CVD process. In a preferred embodiment, layer 106 has a relatively uniform thickness of between about 10 angstroms and about 100 angstroms, and more preferably of between about 30 angstroms and about 50 angstroms.

Figure 1C:
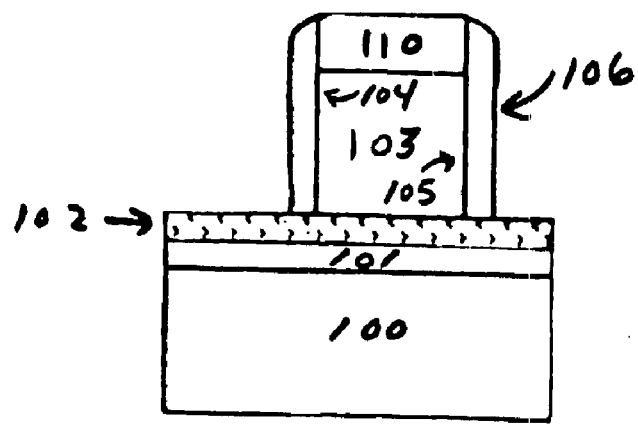

After layer 106 is deposited, an anisotropic plasma dry etch process may be applied to remove the sacrificial layer from metal layer 102, generating the FIG. 1*c* structure. Such a process may employ a plasma that is derived from a combination of $CH_3F$, carbon monoxide, oxygen and argon. That process step leaves metal layer 102 exposed, except where masking layer 103 covers that layer—while layer 106 continues to protect sides 104, 105.

Figure 1D:
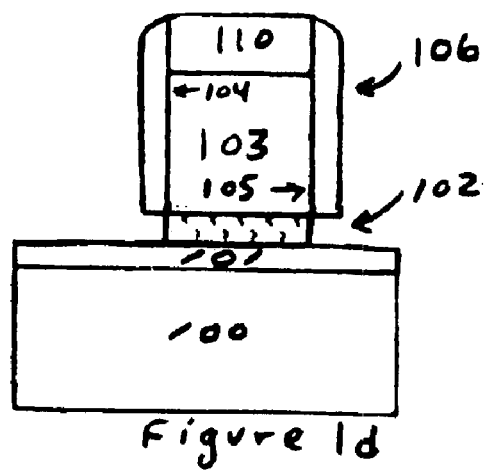

The exposed part of metal layer 102 is then removed to generate the FIG. 1*d* structure. A two step process may be used to remove metal layer 102. First, a dry etch process, e.g., one using a plasma derived from the combination of hydrogen bromide, chlorine, argon, and oxygen, is applied to etch the exposed part of metal layer 102 selective to dielectric layer 101 and sacrificial layer 106. Next, a wet etch process is applied to remove the part of metal layer 102 that is located beneath sacrificial layer 106. The wet etch process must be controlled to prevent a significant amount of metal layer 102 from being removed from beneath masking layer 103. The presence of sacrificial layer 106 on sides 104, 105 of masking layer 103 may prevent that wet etch step from removing a meaningful amount of metal layer 102 from beneath masking layer 103.

Figure 1E:
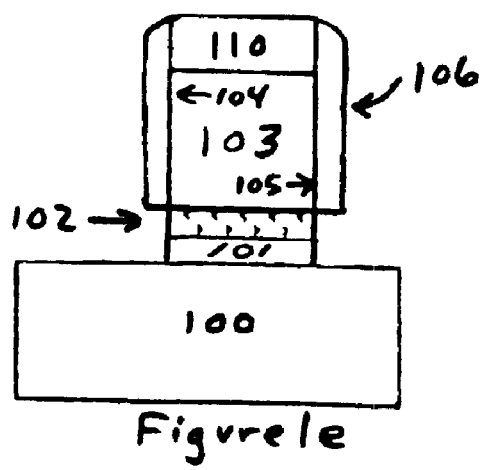
Figure 1F:
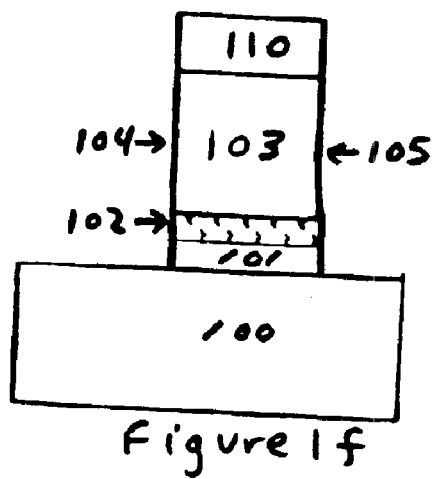

After metal layer 102 is etched, the exposed underlying part of dielectric layer 101 is removed, as shown in FIG. 1*e*. In a preferred embodiment, the exposed part of dielectric layer 101 is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid preferably contains between about 75% and about 95% $H_3PO_4$ by volume. An etch process that uses such an acid preferably takes place at between about 140° C. and about 180° C., and more preferably at about 160° C. When such an acid is used, the exposure step should last between about 30 seconds and about 5 minutes—and preferably for about one minute for a 20 angstrom thick film.

In the illustrated embodiment, at least some of sacrificial layer 106 remains after the exposed part of dielectric layer 101 has been removed. The remaining part of that sacrificial layer is then removed, generating the FIG. 1*f* structure. A wet etch process may be applied to remove the remaining portion of layer 106. Although in this embodiment some of sacrificial layer 106 remains after dielectric layer 101 has been etched, in other embodiments the wet etch processes that remove part of metal layer 102 and the exposed part of dielectric layer 101 may remove the remainder of sacrificial layer 106 at the same time.

Process steps for completing the device that follow removal of the sacrificial layer, e.g., forming sidewall spacers on the gate electrode stack, source and drain regions and the device's contacts, are well known to those skilled in the art and will not be described in more detail here. In this regard, using dummy doped polysilicon layers for masking layer 103 may enable one to apply commonly used nitride spacer, source/drain, and silicide formation techniques, when completing the structure. During those subsequent process steps, hard mask 110 may be retained to prevent a significant part of masking layer 103 from being converted into a silicide. Conversely, if it is desirable to subsequently convert part or all of masking layer 103 into a silicide, then hard mask 110 must be removed beforehand.

FIGS. 2a–2k illustrate structures that may be formed, when carrying out a second embodiment of the method of the present invention. Initially, dielectric layer 201 is formed on substrate 200, generating the FIG. 2a structure. As indicated above, dielectric layer 201 preferably comprises a high-k gate dielectric layer. First metal layer 202 is then formed on dielectric layer 201, and part of that layer is masked by masking layer 203—generating the FIG. 2b structure. First metal layer 202 may comprise any conductive material from which a metal gate electrode may be derived. When first metal layer 202 comprises an n-type metal, it may be formed from any of the n-type materials identified above, using well known PVD or CVD processes, preferably has a workfunction that is between about 3.9 eV and about 4.2 eV, and preferably is between about 25 angstroms and about 300 angstroms thick.

Masking layer 203 may be formed from conventional materials using conventional techniques. In one embodiment, masking layer 203 may comprise a silicon nitride or silicon dioxide hard mask, which may be formed using deposition and patterning techniques that are well known to those skilled in the art. After forming masking layer 203, a dry or wet etch process is applied to remove part of first metal layer 202, leaving part of dielectric layer 201 exposed. After first metal layer 202 is etched, the remainder of masking layer 203 is removed, generating the FIG. 2c structure.

Figure 2A:
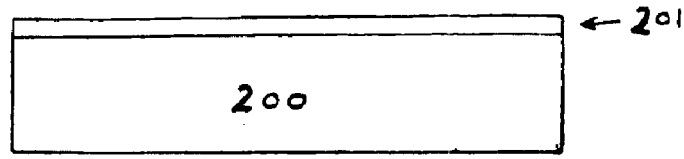
FIGS. 2a–2k represent cross-sections of structures that may be formed when carrying out a second embodiment of the method of the present invention.
Figure 2B:
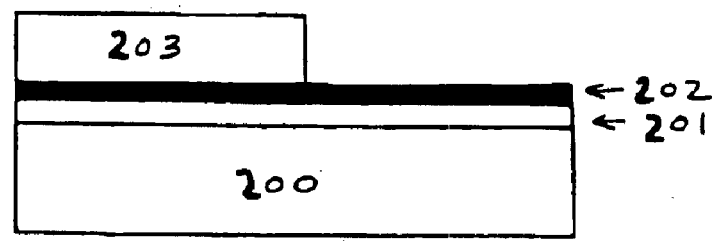
Figure 2C:
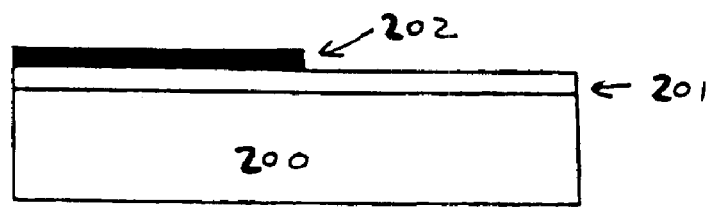
Figure 2D:
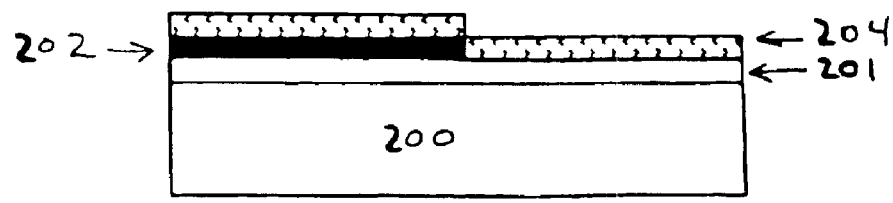

In this embodiment, second metal layer 204 is then deposited on first metal layer 202 and on the exposed part of dielectric layer 201—generating the FIG. 2d structure. When first metal layer 202 comprises an n-type metal, second metal layer 204 preferably comprises a p-type metal, e.g., one of the p-type metals identified above. When second metal layer 204 comprises a p-type material, it may be formed on dielectric layer 201 and first metal layer 202 using a conventional PVD or CVD process, preferably is between about 25 angstroms and about 300 angstroms thick, and preferably has a workfunction that is between about 4.9 eV and about 5.2 eV.

Figure 2E:
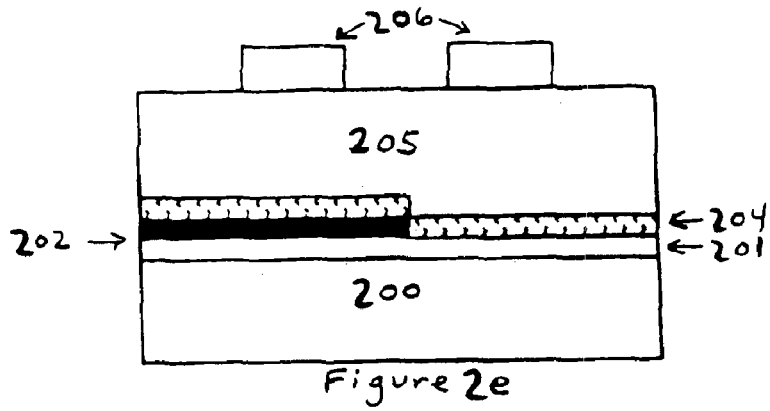
Figure 2F:
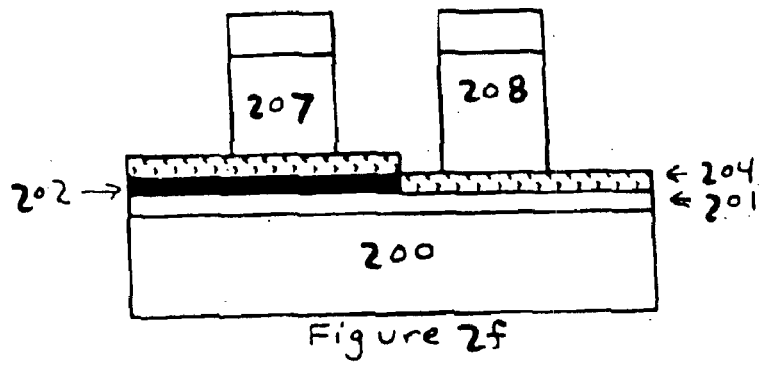

After depositing second metal layer 204 on first metal layer 202 and dielectric layer 201, masking layer 205 is deposited on second metal layer 204. Masking layer 206 is then formed on masking layer 205 to define sections of masking layer 205 to be removed and sections to be retained. FIG. 2e represents a cross-section of the structure that results after masking layer 206 is formed on masking layer 205. In a preferred embodiment, masking layer 205 comprises polysilicon, and masking layer 206 comprises silicon nitride or silicon dioxide. After layer 206 is formed, part of layer 205 is removed selective to second metal layer 204, e.g., using a dry etch process, to expose part of layer 204 and to create the FIG. 2f structure.

Figure 2G:
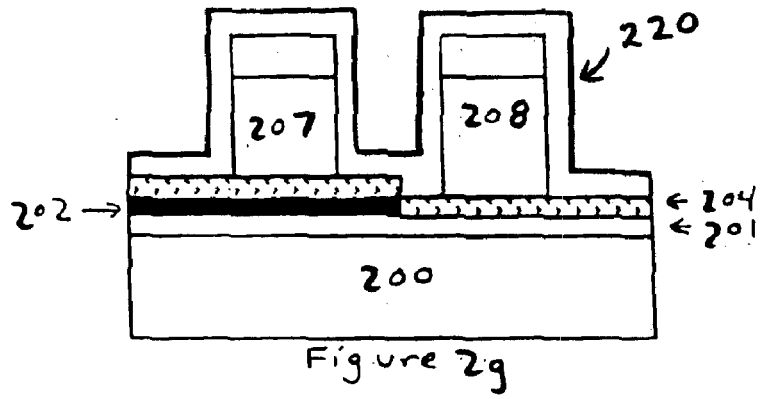
Figure 2H:
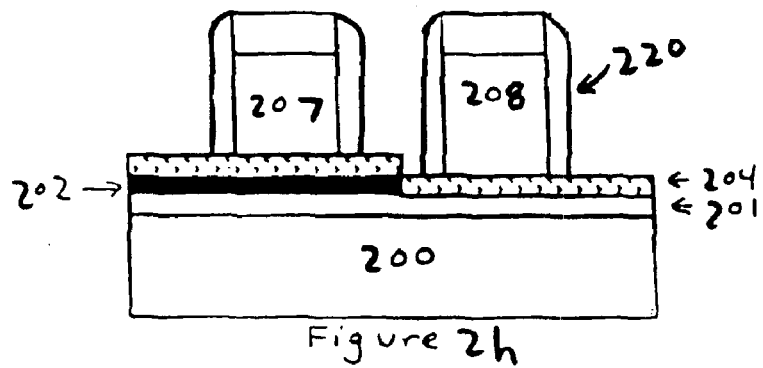

After etching masking layer 205, the sides of masking structures 207, 208 are lined with sacrificial layer 220, generating the FIG. 2g structure. Sacrificial layer 220 may comprise any of the materials identified above, and may be formed using a conventional CVD process. After layer 220 is deposited, an anisotropic plasma dry etch process may be applied to remove parts of that layer from second metal layer 204, generating the FIG. 2h structure.

Figure 2I:
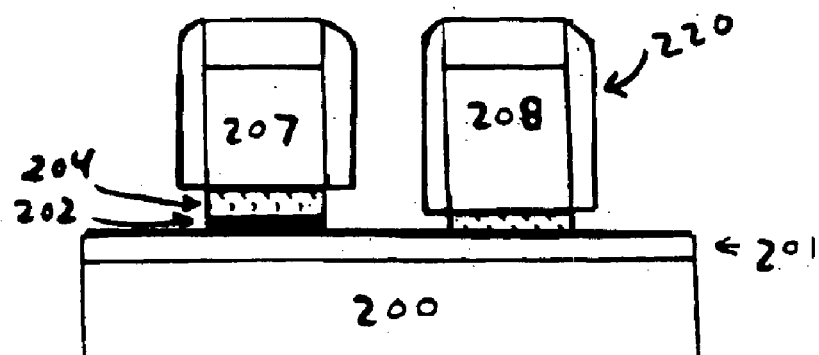
Figure 2J:
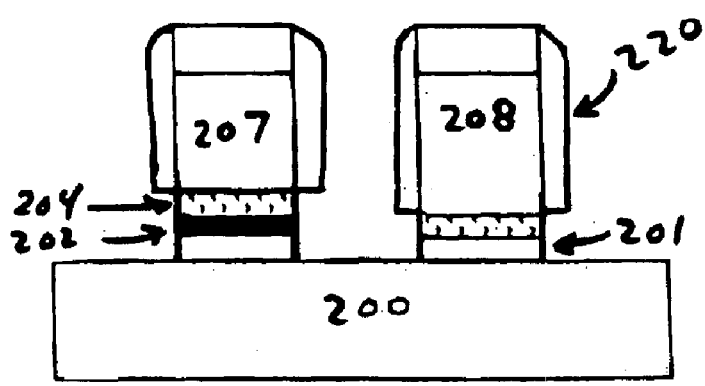

The exposed part of second metal layer 204 and the underlying portion of first metal layer 202 are then removed, followed by removing the portions of those layers that are located below sacrificial layer 220, to generate the FIG. 2i structure. A combination of dry and wet etch processes may be used to remove those layers, as described above. After metal layers 204 and 202 are etched, a wet etch process is applied to remove the exposed part of dielectric layer 201, generating the FIG. 2j structure.

Figure 2K:
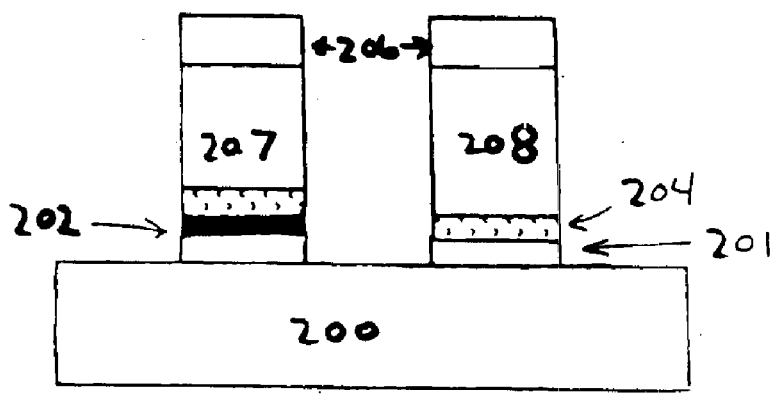

After removing the exposed part of dielectric layer 201, a wet etch process is applied to remove the remainder of sacrificial layer 220 from the sides of masking structures 207, 208, as shown in FIG. 2k. As indicated above, such a wet etch process may be unnecessary, if the wet etch processes used to etch metal layers 204 and 202 from beneath sacrificial layer 220, and to etch dielectric layer 101, simultaneously remove the remainder of sacrificial layer 220.

Because process steps for completing the device that follow removal of sacrificial layer 220 are well known to those skilled in the art, they will be omitted here. As with the previously described embodiment, hard masks 206 may be removed prior to converting masking structures 207, 208 into a silicide, or retained to prevent significant portions of structures 207, 208 from being converted into a silicide during subsequent process steps.

In this embodiment, metal layers of different conductivity type may be deposited in either order. As illustrated, first metal layer 202 may comprise an n-type metal, and second metal layer 204 may comprise a p-type metal. Alternatively, first metal layer 202 may comprise a p-type metal, and second metal layer 204 may comprise an n-type metal. It may, for example, be desirable to form first metal layer 202 from a p-type material, when masking layer 205 comprises a doped polysilicon layer, and it is necessary to apply a high temperature anneal to that layer, e.g., when a subsequently formed silicide will not extend completely through it.

The three layer gate electrode stack of FIG. 2k may serve as the gate electrode for an NMOS transistor with a workfunction between about 3.9 eV and about 4.2 eV, while the two layer gate electrode stack may serve as the gate electrode for a PMOS transistor with a workfunction between about 4.9 eV and about 5.2 eV. Alternatively, the three layer gate electrode stack may serve as the gate electrode for a PMOS transistor, while the two layer gate electrode stack may serve as the gate electrode for an NMOS transistor.

The first metal layer should set the transistor's workfunction, regardless of the composition of the remainder of the gate electrode stack. For that reason, the presence of the second metal layer on top of the first metal layer in the three layer gate electrode stack, and the presence of a dummy doped polysilicon layer in either a three or two layer gate electrode stack, should not affect the workfunction of that stack in a meaningful way.

Although such a polysilicon layer should not affect the workfunction of an underlying metal layer, that polysilicon layer may serve as an extension of the transistor's contacts, as well as a support for the nitride spacers. It also defines the transistor's vertical dimension. Gate electrode stacks that include such a polysilicon layer are thus considered to be "metal gate electrodes," as are gate electrode stacks that include one or more metal layers, but do not include a polysilicon layer.

As illustrated above, the method of the present invention enables one to etch a metal layer without depositing undesirable residues on the sides of an overlying masking layer and without removing significant portions of the metal layer from beneath that masking layer. Although the embodiments described above provide examples of desirable metal layer etch processes, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a dielectric layer on a substrate;

forming a metal layer on the dielectric layer;

forming on the metal layer a masking layer that has first and second sides;

lining the first and second sides of the masking layer with a sacrificial layer;

applying a plasma dry etch process to etch a first pant of the metal layer, and applying a wet etch process to etch a second part of the metal layer;

applying a wet etch process to etch the dielectric layer; and applying a wet etch process to remove the sacrificial layer.

2. A method for making a semiconductor device comprising:

forming a dielectric layer on a substrate;

forming a first metal layer on a first part of the dielectric layer, leaving a second part of the dielectric layer exposed;

forming a second metal layer on the first metal layer and on the second part of the dielectric layer;

forming on the second metal layer a masking layer that has first and second sides;

lining the first and second sides of the masking layer with a sacrificial layer;

applying a plasma dry etch process to etch a first part of the second metal layer and a first part of the first metal layer, and applying a wet etch process to etch a second part of the second metal layer and a second part of the first metal layer;

applying a wet etch process to etch the dielectric layer; and applying a wet etch process to remove the sacrificial layer.

3. A method for making a semiconductor device comprising:

forming a high-k gate dielectric layer on a substrate;

forming a first metal layer on the high-k gate dielectric layer;

removing part of the first metal layer;

forming a second metal layer on the first metal layer and on the high-k gate dielectric layer, a first part of the second metal layer covering the remaining part of the first metal layer and a second part of the second metal layer covering the high-k gate dielectric layer;

forming a polysilicon layer on the second metal layer;

removing part of the polysilicon layer to generate a patterned polysilicon layer that has first and second sides, and to expose a third part of the second metal layer;

depositing a sacrificial layer that comprises a material that is selected from the group consisting of silicon nitride, a carbon doped silicon nitride, and silicon dioxide onto the second metal layer, and onto the first and second sides of the patterned polysilicon layer, then applying an anisotropic plasma dry etch process to remove the sacrificial layer from the second metal layer;

removing the exposed third part of the second metal layer and the underlying part of the first metal layer; and removing the sacrificial layer.

* * * * *